(12) United States Patent  
Kronberger

(10) Patent No.: US 7,808,160 B2  
(45) Date of Patent: Oct. 5, 2010

(54) PIEZOACTUATOR, METHOD FOR PRODUCING A PIEZOACTUATOR AND INJECTION SYSTEM OF SAID PIEZOACTUATOR

(75) Inventor: Maximilian Kronberger, Steyr (AT)

(73) Assignee: Continental Automotive GmbH, Hannover (DE)

( * ) Notice: Subject to any disclaimer, the term of this patent is extended or adjusted under 35 U.S.C. 154(b) by 135 days.

(21) Appl. No.: 12/299,663

(22) PCT Filed: May 3, 2007

(86) PCT No.: PCT/EP2007/054280

§ 371 (c)(1),
(2), (4) Date: Nov. 5, 2008

(87) PCT Pub. No.: WO2007/128764

PCT Pub. Date: Nov. 15, 2007

(65) Prior Publication Data

US 2009/0096324 A1     Apr. 16, 2009

(30) Foreign Application Priority Data

May 8, 2006    (EP) .................................. 06009445

(51) Int. Cl.
*H01L 41/08* (2006.01)
(52) U.S. Cl. ....................................... 310/346; 310/328
(58) Field of Classification Search ................. 310/346, 310/328
See application file for complete search history.

(56) References Cited

U.S. PATENT DOCUMENTS 6,333,587  B1   12/2001  Heinz et al.
6,552,472  B1    4/2003  Heinz
6,899,284  B1    5/2005  Boecking
6,943,482  B2    9/2005  Bindig et al.
7,250,709  B2    7/2007  Flaemig-Vetter et al.
2004/0217672 A1  11/2004  Bindig et al.
2005/0072863 A1   4/2005  Bachmaier (Continued)

FOREIGN PATENT DOCUMENTS

WO     WO 00/34700 A1     6/2000

(Continued)

OTHER PUBLICATIONS

Written Opinion of the International Searching Authority (Supplemary Sheet), PCT/EP2007/054280, 3 pages, Apr. 2005.

*Primary Examiner*—Mark Budd
(74) *Attorney, Agent, or Firm*—King & Spalding L.L.P.

(57) ABSTRACT

A piezoactuator for injecting fuel with a predetermined fuel pressure has an at least laterally narrowing casing around the internal space of the actuator which has a first temperature- and/or pressure-dependent volume change, a piezo stack located in the internal space which has a second temperature- and/or pressure-dependent volume change, a transmission element which is located between the piezo stack and the casing for transmitting the fuel pressure on the outside of the casing onto the piezo stack, wherein the transmission element has a passivating liquid which has a third temperature- and/or pressure-dependent volume change as well as several preformed bodies which have a fourth temperature- and/or pressure-dependent volume change; wherein the relation between the passivating liquid and the preformed bodies is set that the first volume change of the casing basically corresponds to an overall internal space volume change which has at least the second, third, and fourth volume change.

20 Claims, 5 Drawing Sheets

U.S. PATENT DOCUMENTS

2006/0087202 A1    4/2006    Flaemig-Vetter et al.

FOREIGN PATENT DOCUMENTS

| WO | WO 00/36657 A1 | 6/2000 |
| WO | WO 0034700 A1 | 6/2000 |
| WO | WO 0036657 A1 | 6/2000 |
| WO | WO 00/60259 A1 | 10/2000 |
| WO | WO 0060259 A1 | 10/2000 |
| WO | WO 02/061856 A1 | 8/2002 |
| WO | WO 02061856 A1 | 8/2002 |
| WO | WO 03/009400 A2 | 1/2003 |
| WO | WO 03009400 A2 | 1/2003 |
| WO | WO 2004/006348 A1 | 1/2004 |
| WO | WO 2004006348 A2 | 1/2004 |
| WO | WO 2006/128842 A1 | 12/2006 |
| WO | WO 2006128842 A1 | 12/2006 |

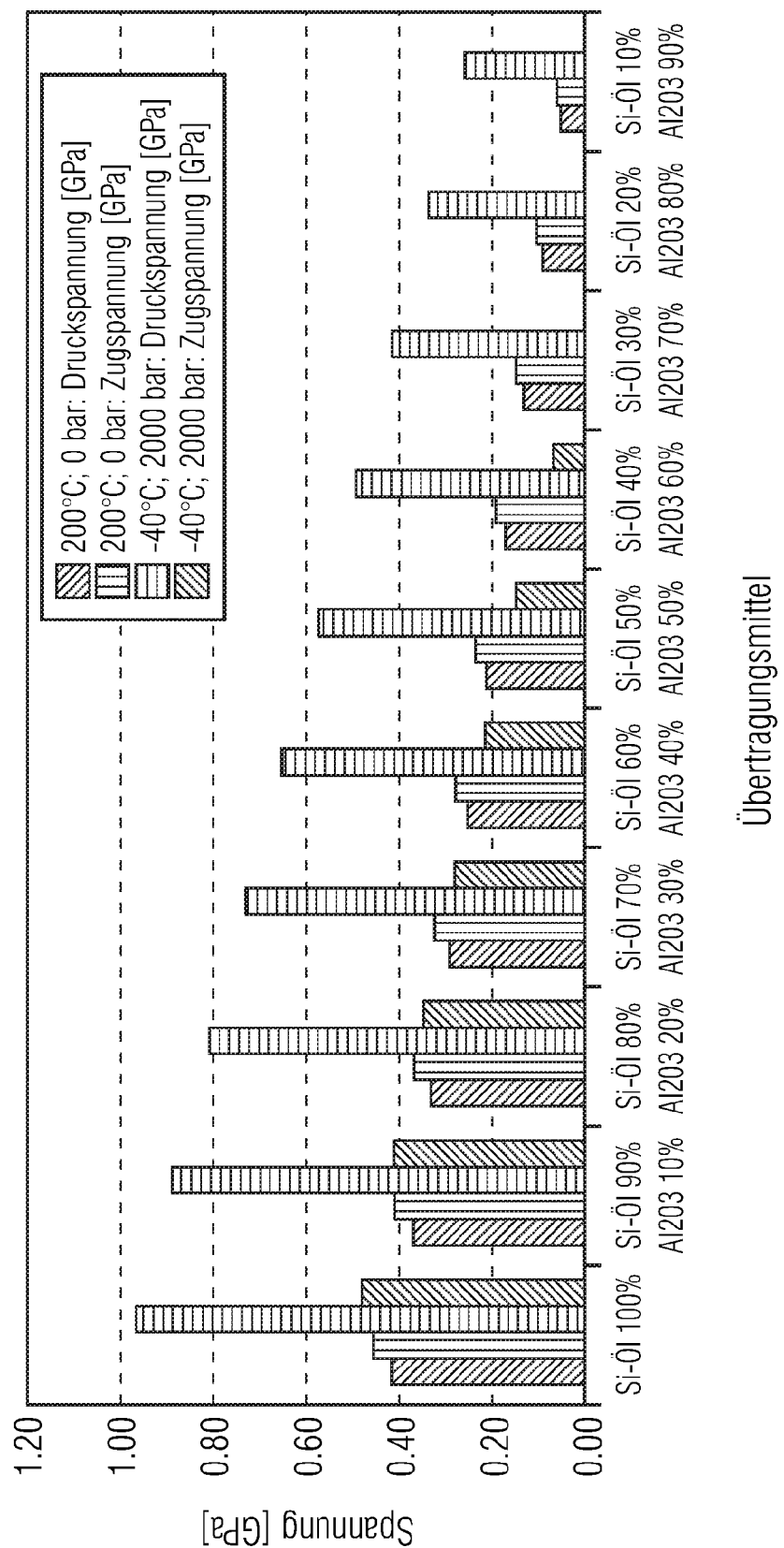

PIEZOACTUATOR, METHOD FOR PRODUCING A PIEZOACTUATOR AND INJECTION SYSTEM OF SAID PIEZOACTUATOR

CROSS-REFERENCE TO RELATED APPLICATIONS

This application is a U.S. National Stage Application of International Application No. PCT/EP2007/054280 filed May 3, 2007, which designates the United States of America, and claims priority to EP Application No. 06009445.5 filed May 8, 2006, the contents of which are hereby incorporated by reference in their entirety.

TECHNICAL FIELD

The invention relates to a piezoelectric actuator, a method for producing a piezoelectric actuator and an injection system having a piezoelectric actuator.

BACKGROUND

Injection systems and in particular leak-oil-free common-rail injection systems require a control element such as, for example, a piezoelectric actuator in the high-pressure chamber. In order to ensure the operational capability of the piezoelectric actuator even under high pressures up to over 2000 bar, the pressure must also be able to act laterally on the piezoelectric stack or, as the case may be, piezoelectric ceramic body so as to assist the expansion capability of the piezoelectric stack of the piezoelectric actuator.

A piezoelectric actuator of the aforesaid kind is described for example in WO 02/061856 A1. In that case the ceramic body of said piezoelectric actuator is enclosed by means of a polymer or plastic sleeve. However, a hermetic sealing of the ceramic body against the fuel subject to a high pressure such as for example 2000 bar is hardly feasible or not feasible with the plastics known on the filing date of the present patent application. Due to an occasionally unavoidable electrical conductivity of commercially available fuels, for example due to a small acid content, even slight wetting of the piezoelectric ceramic can lead to voltage flashovers between the internal electrodes of the piezoelectric actuator. Moreover, high expansions of the plastic encapsulation which exacerbate this problem occur at the polarization cracks. WO 02/061856 also describes the use of a filler material between the piezoelectric stack and the polymer or plastic sleeve. In the case of the described filler material there is, however, the problem that during an expansion of the piezoelectric stack the filler material can flow into resulting spaces or joints and be destroyed in the event of a movement of the piezoelectric stack in the opposite direction. Thus, the filler material will be used up or destroyed over the service life of the piezoelectric actuator. The reduced filler material nevertheless means that the pressure being applied externally to the piezoelectric actuator can no longer be transferred efficiently onto the piezoelectric stack.

Also known to the applicant for the purpose of transferring the pressure onto the piezoelectric stack of the piezoelectric actuator is a solution having a hermetically sealed metal sleeve which transfers the hydraulic forces by means of a fluid, such as a silicone oil for example, onto the side surfaces of the piezoelectric ceramic body. However, this solution known internally to the applicant has the disadvantage that the coefficient of thermal expansion of silicone oil is orders of magnitude greater than that of the metal sleeve.

As a result, in particular the tensile stresses in the metal sleeve increase if there is an increase in temperature. The tensile stresses could be reduced by suitable moldings of the expansion folds of the metal sleeve or, as the case may be, metal bellows in the longitudinal and transverse directions. However, with a square-shaped piezoelectric stack, which is cheaper by comparison with piezoelectric stacks having other cross-sectional shapes, the stresses nonetheless increase to an unacceptably high level due to the relatively large volume of fluid. Since the ceramic material of the piezoelectric stack possesses a very low thermal expansion, it is also known internally to the applicant to make the volume of the piezoelectric stack as large as possible compared to the filling. For that purpose the piezoelectric stack could be embodied as a circular cylindrical shape for example. The circular cylindrical embodiment of the piezoelectric stack is considerably more complicated and labor-intensive in manufacturing terms, however, and consequently significantly more cost-intensive than a square-shaped piezoelectric stack.

SUMMARY

A piezoelectric actuator can be provided in which a pressure applied externally to the piezoelectric actuator is transferred onto and in particular distributed over the piezoelectric stack of the piezoelectric actuator as efficiently as possible.

Furthermore, a piezoelectric actuator can be created which is protected against voltage flashovers in particular also in a high-pressure environment, for example also at in excess of 2000 bar.

Furthermore, a piezoelectric actuator can be provided in which a pressure applied externally to the piezoelectric actuator puts the piezoelectric stack under a quasi-isostatic all-round pressure.

Also, a piezoelectric actuator can be provided having as long a lifespan as possible.

The metal sleeve or, as the case may be, metal bellows can be protected against high or excessively high stresses as a result of high temperatures, high pressures, high temperature changes and/or high pressure changes, and so to provide a long service life for the piezoelectric actuator.

According to an embodiment, a piezoelectric actuator for injecting fuel at a predetermined fuel pressure; may comprise: a) a casing at least laterally delimiting an actuator interior space and exhibiting at least one of a temperature- and pressure-dependent first change in volume; b) a piezoelectric stack arranged in the actuator interior space and exhibiting at least one of a temperature- and pressure-dependent second change in volume; c) a transfer agent arranged between the piezoelectric stack and the casing for the purpose of transferring the fuel pressure applied externally to the casing onto the piezoelectric stack, the transfer agent having a passivating fluid which exhibits at least one of a temperature- and pressure-dependent third change in volume and a plurality of preformed bodies which exhibit at least one of a temperature- and pressure-dependent fourth change in volume, the ratio between the passivating fluid and the preformed bodies being set in such a way that the first change in volume of the casing essentially corresponds to an overall change in volume of the actuator interior space which includes at least the second, third and fourth change in volume.

According to a further embodiment, the actuator interior space can be delimited by a top plate, a base plate, the casing and by the piezoelectric stack. According to a further embodiment, a difference between the overall change in volume of the actuator interior space and the first change in volume of the casing may lie in a predetermined tolerance range.

According to a further embodiment, the piezoelectric stack can be embodied as square-shaped, polygonal or circular cylindrical. According to a further embodiment, the casing can be embodied as a corrugated tube which has a plurality of N corrugations and in particular is made of metal. According to a further embodiment, the passivating fluid can be embodied as a silicone oil. According to a further embodiment, the preformed bodies may be embodied as a plurality of balls which each have in particular a maximum diameter of 200 μm and/or consist of an oxide ceramic. According to a further embodiment, the balls can be arranged in the passivating fluid in the densest ball packing. According to a further embodiment, the preformed bodies can be embodied as elastic transfer elements, with preferably at least two elastic transfer elements molded to match the corrugated shape being arranged in at least one corrugation. According to a further embodiment, the elastic transfer element can be embodied from at least one of steel, ceramic, invar, nylon, and an elastomer, in particular Teflon. According to a further embodiment, the corrugated tube can be embodied as a longitudinally and transversely expandable corrugated tube. According to a further embodiment, the transfer agent can be arranged between the casing and the piezoelectric stack in at least one of a form-fit and force-fit manner. According to a further embodiment, the coefficient of thermal expansion of the preformed bodies may be ten to fifty times, preferably twenty to forty times, particularly preferably twenty-five to thirty-five times less than the coefficient of thermal expansion of the passivating fluid.

According to another embodiment, a method for producing a piezoelectric actuator as claimed in claim 1, may comprise the steps: a) arranging a piezoelectric stack in an actuator interior space, the piezoelectric stack exhibiting at least one of a temperature- and pressure-dependent second change in volume; b) at least laterally delimiting the actuator interior space by means of a casing which exhibits at least one of a temperature- and pressure-dependent first change in volume; c) filling the remaining actuator interior space between the piezoelectric stack and the casing with a passivating fluid for the purpose of transferring the fuel pressure applied externally to the casing onto the piezoelectric stack, the fluid exhibiting at least one of a temperature- and pressure-dependent third change in volume; d) setting an overall change in volume which includes at least the second, third and fourth change in volume by means of the packing of a plurality of preformed bodies which exhibit at least one of a temperature- and pressure-dependent fourth change in volume into the passivating fluid in such a way that the overall change in volume of the actuator interior space essentially corresponds to the first change in volume of the casing.

According to yet another embodiment, in an injection system having a piezoelectric actuator as described above, the piezoelectric actuator can be arranged in a high-pressure chamber of the injection system.

According to a further embodiment, the injection system can be embodied as a common-rail injection system.

BRIEF DESCRIPTION OF THE DRAWINGS

The invention is explained in more detail below with reference to the exemplary embodiments shown in the schematic figures, in which:

FIG. 5 is a diagram representing the resulting maximum principal normal stresses as a function of the mixing ratio of the transfer agent.

Unless explicitly indicated otherwise, identical or functionally identical elements and objects have been assigned the same reference signs in all the figures.

DETAILED DESCRIPTION

Figure 1:
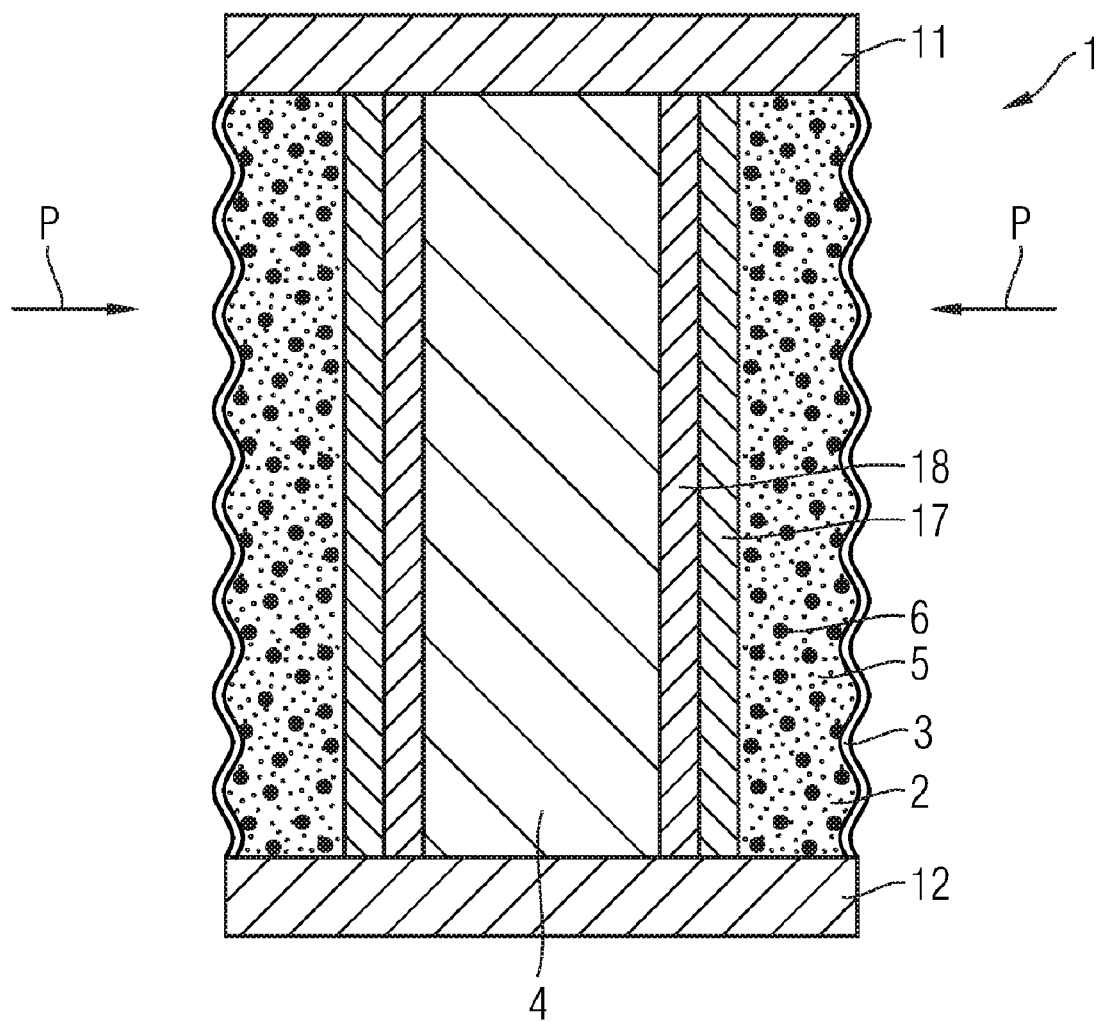
FIG. 1 shows a schematic longitudinal sectional view of a first exemplary embodiment of the piezoelectric actuator.

According to various embodiments, therefore, a piezoelectric actuator for injecting fuel at a predetermined fuel pressure is proposed which has:
a casing which at least laterally delimits an actuator interior space and exhibits a temperature- and/or pressure-dependent first change in volume,
a piezoelectric stack, arranged in the actuator interior space, which exhibits a temperature- and/or pressure-dependent second change in volume,
a transfer agent arranged between the piezoelectric stack and the casing for the purpose of transferring the fuel pressure applied externally to the casing onto the piezoelectric stack, wherein the transfer agent has a passivating fluid which exhibits a temperature- and/or pressure-dependent third change in volume and a plurality of preformed bodies which exhibit a temperature- and/or pressure-dependent fourth change in volume, with the ratio between the passivating fluid and the preformed bodies being set such that the first change in volume of the casing essentially corresponds to an overall change in volume of the actuator interior space which includes at least the second, third and fourth change in volume.

Within the context of this application "preformed" means that the preformed bodies have a predeterminable and predetermined shape.

The transfer agent having the fluid is advantageously passivating according to various embodiments so that a voltage flashover between the piezoelectric actuator and units or elements of any kind that are arranged outside the transfer agent, such as the casing of the piezoelectric stack for example, is avoided.

A further advantage according to various embodiments of the transfer agent is that it can transfer a pressure applied externally to the casing, in particular the fuel pressure, onto the piezoelectric stack and distribute said pressure in particular homogeneously. Thus, the expansion capability of the piezoelectric stack is assisted by the laterally acting fuel pressure, as a result of which the operating characteristics of the piezoelectric actuator are significantly improved.

A further advantage of the piezoelectric actuator according to various embodiments is that the change in volume of the casing as a result of changes in temperature and/or pressure essentially corresponds to the change in volume of the actuator interior space. Accordingly, stresses acting on the casing as a result of changes in temperature and/or pressure are minimized, thereby maximizing the useful life of the casing and hence the useful life of the piezoelectric actuator.

A further advantage of the transfer agent according to various embodiments is its optimal composition in terms of its thermal expansion and its pressure transfer capability. In this case the passivating fluid serves for homogeneously transferring the fuel pressure onto the piezoelectric stack and for reducing the internal friction of the transfer agent or, as the case may be, of the preformed bodies between casing and piezoelectric stack. The increased mobility of the transfer agent or, as the case may be, of the preformed bodies that is provided by means of the fluid serves to compensate for the different local deformations in the casing as a result of the external fuel pressure and the working stroke of the piezoelectric actuator. Conversely, the preformed bodies serve to reduce the thermal expansion of the transfer agent taken as a whole and in addition to increase the rigidity of the transfer agent.

Further embodiments will emerge from the description with reference to the drawings.

According to an embodiment, the actuator interior space is delimited by a top plate, a base plate, the casing and by the piezoelectric stack.

According to a further embodiment, a difference between the overall change in volume of the actuator and the first change in volume of the casing lies within a predetermined tolerance range. In practice it is very difficult due to manufacturing constraints to set the overall change in volume of the actuator interior space by setting the ratio between the passivating fluid and the preformed bodies in such a way that the overall change in volume exactly corresponds to the first change in volume. Accordingly, a tolerance range is predetermined in which changes of less than 30%, preferably less than 10%, particularly preferably less than 5%, are permitted. The ratio between passivating fluid and the preformed bodies is then set as a function of said predetermined tolerance range.

According to a further embodiment, the piezoelectric stack is embodied as square-shaped, polygonal or circular cylindrical.

According to a further embodiment, the casing is embodied as a corrugated tube which has a plurality of N corrugations and in particular is made of metal. According to various embodiments the absorption of relative movements is improved as a result of the corrugated-tube-like embodiment of the casing. The corrugated tube is in particular made of metal and advantageously enables the piezoelectric actuator to be protected against voltage flashovers even given an unavoidable electrical conductivity of commercially available fuels.

According to a further embodiment, the passivating fluid is embodied as a silicone oil.

According to a further embodiment, the preformed bodies are embodied as a plurality of balls which each have in particular a maximum diameter of 200 μm and/or consist of an oxide ceramic. Oxide ceramic balls possess the particular advantage of having similar or identical coefficients of thermal expansion to the ceramic piezoelectric stack. In order to ensure an optimal mobility of the balls, these are embodied with a maximum diameter of 200 μm.

According to a further embodiment, the balls are arranged in the passivating fluid in the densest ball packing. A demixing of the balls and the passivating fluid is advantageously prevented in this way. A demixing would disadvantageously result in the actuator interior space having a not inconsiderable uneven distribution of the balls, which would lead to an inhomogeneous transfer of pressure onto or distribution of pressure over the piezoelectric stack.

According to a further embodiment, the preformed bodies are embodied as elastic transfer elements, with at least two elastic transfer elements molded to match the corrugated shape preferably being arranged in at least one corrugation. The transfer element according to various embodiments is preformed and elastic and consequently possesses only slight viscous properties, with the result that a flowing of the transfer element into the joints of the piezoelectric stack is largely avoided or is impossible. Within the context of this application "elastic" means that the said agent has only a low viscosity and consequently cannot flow away into narrow gaps. Elastic therefore means essentially non-viscous or only very slightly viscous. Preformed means that the agent has a predeterminable and predetermined shape. Since the transfer element according to various embodiments cannot flow into the joints of the piezoelectric stack, it also cannot be destroyed between the joints by the moving piezoelectric stack, in particular during operation of the piezoelectric actuator. A considerably longer useful life therefore results for the transfer element according to various embodiments.

According to a further embodiment, the elastic transfer element is embodied from steel and/or ceramic and/or invar and/or nylon (PA66) and/or from an elastomer, in particular Teflon.

According to a further embodiment, the corrugated tube is embodied as a longitudinally and transversely expandable corrugated tube.

According to a further embodiment, the transfer agent is arranged between the casing and the piezoelectric stack in a form-fit and/or force-fit manner. The form-fitted and force-fitted transfer agent is in particular advantageously suitable for transferring the pressure applied externally to the casing onto the very rigid piezoelectric ceramic and thereby keeping the pressure difference arising in the casing as small as possible. The elastic transfer element is preferably also embodied as having a large surface area at the transition zones to the piezoelectric stack and to the casing, thereby advantageously maximizing the elastic deformability.

According to a further embodiment, the coefficient of thermal expansion of the preformed bodies is ten to fifty times, preferably twenty to forty times, particularly preferably twenty-five to thirty times, less than the coefficient of thermal expansion of the passivating fluid.

The below-explained exemplary embodiments of the piezoelectric actuator 1 according to FIGS. 1 to 3 have the following in common:

The piezoelectric actuator 1 according to various embodiments for injecting fuel at a predetermined fuel pressure P has a casing 3 at least laterally delimiting an actuator interior space 2, a piezoelectric stack 4 arranged in the actuator interior space 2 and a transfer agent 5; 6, 7-10 for the purpose of transferring the fuel pressure P applied externally to the casing 3 onto the piezoelectric stack 4. The transfer agent 5; 6, 7-10 is arranged between the piezoelectric stack 4 and the casing 3.

The casing 3 exhibits a temperature- and/or pressure-dependent first change in volume $\Delta V1$. This means that the volume of the casing 3 changes as a result of a change in pressure and/or a change in temperature. The actuator 2 is also delimited by a top plate 11, a base plate 12, the casing 3 and by the piezoelectric stack 4. The casing 3 is preferably embodied as a corrugated tube which has a plurality of N corrugations and in particular is made of metal. The corrugated tube 3 is embodied in particular as a longitudinally and transversely expandable corrugated tube.

The piezoelectric stack 4 arranged in the actuator interior space 2 exhibits a temperature- and/or pressure-dependent second change in volume $\Delta V2$. The piezoelectric stack 4 is preferably embodied as square-shaped, polygonal or circular cylindrical.

The transfer agent 5; 6, 7-10 has a passivating fluid 5 which exhibits a temperature- and/or pressure-dependent third change in volume $\Delta V3$, and a plurality of preformed bodies 6, 7-10 which exhibit a temperature- and/or pressure-dependent fourth change in volume $\Delta V4$. The passivating fluid 5 is preferably a silicone oil. According to the various embodiments, the ratio, in particular the quantitative ratio, between the passivating fluid 5 and the preformed bodies 6, 7-10 is set such that the first change in volume $\Delta V1$ of the casing 3 essentially corresponds to an overall change in volume $\Delta Vin$ of the actuator interior space 2. In this case the overall change in volume $\Delta Vin$ includes all changes in volume of the devices or bodies contained in the actuator 2. Thus, the overall change in volume $\Delta Vin$ of the actuator interior space 2 includes at least the second change in volume $\Delta V2$ of the piezoelectric stack 4, the third change in volume $\Delta V3$ of the passivating fluid 5 and the fourth change in volume $\Delta V4$ of the plurality of preformed bodies 6, 7-10.

The difference between the overall change in volume $\Delta Vin$ of the actuator interior space 2 and the first change in volume $\Delta V1$ of the casing 3 lies in a predetermined tolerance range which includes deviations of less than or equal to 30%, preferably of less than or equal to 10%, particularly preferably of less than or equal to 5%. As long as the difference between the overall change in volume $\Delta Vin$ of the actuator interior space 2 and the first change in volume $\Delta V1$ of the casing 3 lies in the predetermined tolerance range, the function according to various embodiments, that is to say the minimization of the stress acting on the casing 3 as a result of changes in temperature and/or changes in pressure, in particular the fuel pressure P, is realized.

In this case the coefficient of thermal expansion of the preformed bodies 6, 7-10 is in particular ten to fifty times, preferably twenty to forty times, particularly preferably twenty-five to thirty-five times less than the coefficient of thermal expansion of the passivating fluid 5.

Figure 2:
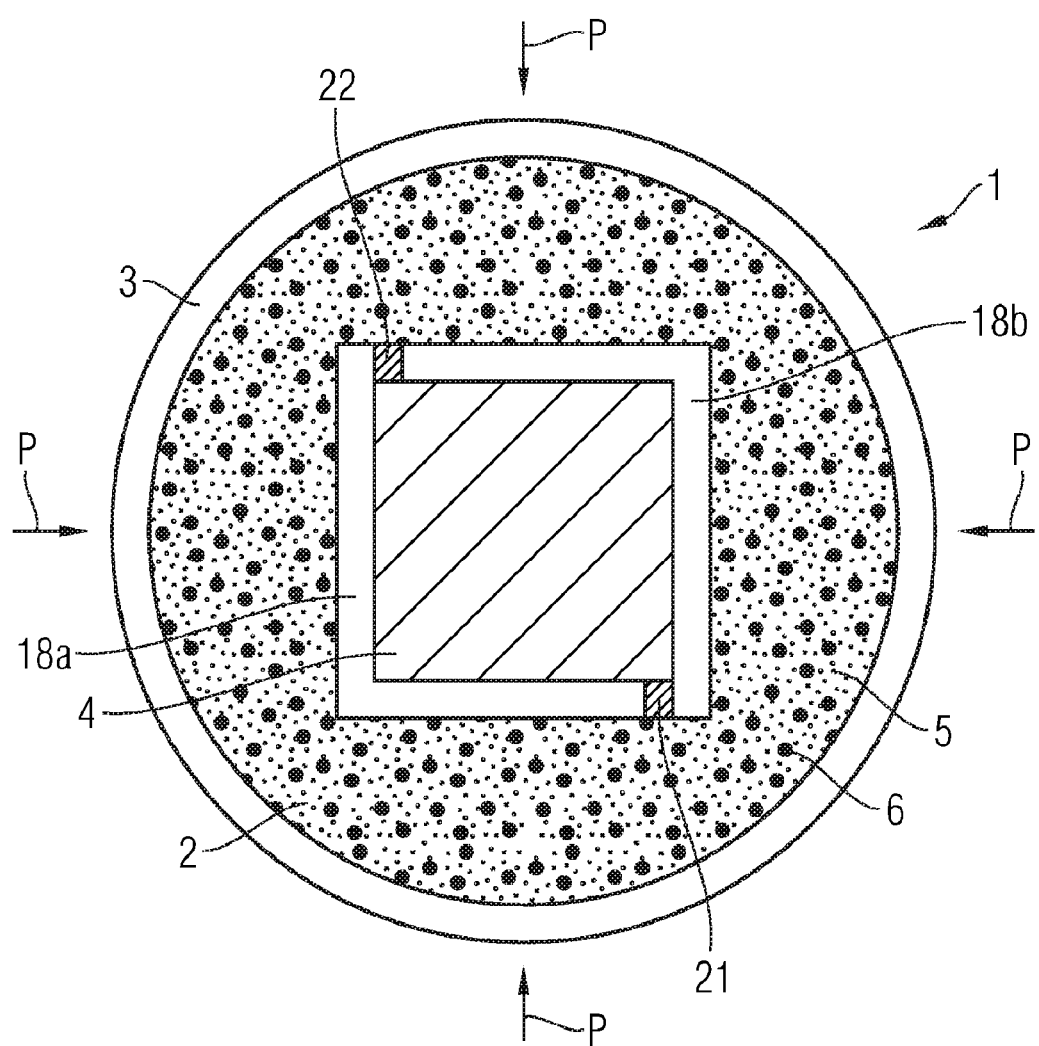
FIG. 2 shows a schematic cross-sectional view of a second exemplary embodiment of the piezoelectric actuator.
Figure 3:
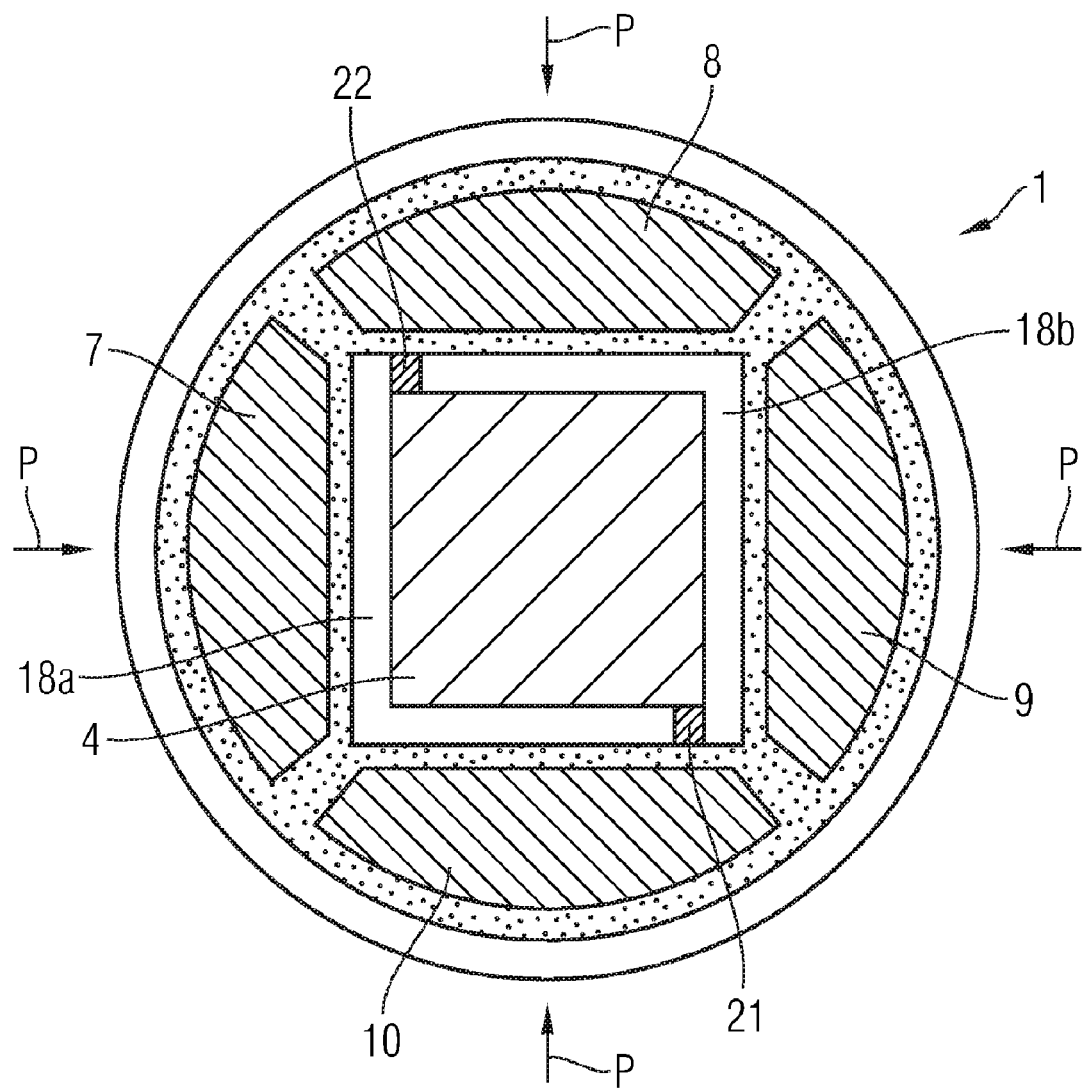
FIG. 3 shows a schematic cross-sectional view of a third exemplary embodiment of the piezoelectric actuator.

The structural layout of the piezoelectric actuator 1 according to the three exemplary embodiments shown in FIGS. 1 to 3 is explained in detail below.

The piezoelectric actuator 1 according to various embodiments and FIG. 1 is arranged between the top plate 11 and the base plate 12. The casing 3 surrounds the piezoelectric actuator 1 laterally. The casing 3 is preferably joined to the top plate 11 and the base plate 12. An actuator interior space 2 exists between the casing 3 and the piezoelectric stack 4. Arranged on the piezoelectric stack 4 in the actuator interior space 2 are a first electrode layer 18a, which is connected for example to a positive supply potential, and a second electrode layer 18b, which is connected for example to a negative supply potential. A passivation layer 17 is arranged in a rotationally symmetrical manner on the electrode layers 18a, 18b. The transfer agent 5, 6, which has the passivating fluid 5 and the ceramic balls 6, is used as a filler between the passivation layer 17 and the casing 3.

FIG. 2 shows a cross-sectional view of a second exemplary embodiment of the piezoelectric actuator 1. The structural layout of the piezoelectric actuator 1 according to FIG. 2 differs from that according to FIG. 1 in that no passivation layer 17 is provided. The latter is not absolutely necessary, since the fluid 5 itself is passivating. The elements labeled with the reference signs 21 and 22 designate separating elements which electrically isolate the two electrode layers 18a and 18b from each other.

FIG. 3 shows a cross-sectional view of a third exemplary embodiment of the piezoelectric actuator 1. The third exemplary embodiment according to FIG. 3 differs from the second exemplary embodiment according to FIG. 2 in that the preformed bodies 7-10 of the transfer agent are embodied as elastic transfer elements 7-10. The elastic transfer elements 7-10 are for example insert parts which are embodied as disk sections shaped to fit the corrugation and the piezoelectric stack 4. The insert parts 7-10 are in particular completely surrounded by or immersed in the fluid 5.

The method for producing a piezoelectric actuator 1 according to various embodiments is explained below with reference to the block diagram shown in FIG. 4. The method comprises the following method steps a to d.

Method Step A:
A piezoelectric stack 4 is arranged in an actuator interior space 2, the piezoelectric stack 4 exhibiting a temperature- and/or pressure-dependent second change in volume $\Delta V2$.

Method Step B:
The actuator interior space 2 is delimited at least laterally by means of a casing 3. The casing 3 exhibits a temperature- and/or pressure-dependent first change in volume $\Delta V1$.

Method Step C:
The remaining actuator interior space 2 between the piezoelectric stack 4 and the casing 3 is filled with a passivating fluid 5. The fluid 5 exhibits a temperature- and/or pressure-dependent third change in volume $\Delta V3$.

Method Step D:
An overall change in volume $\Delta Vin$, which includes at least the second, third and fourth change in volume $\Delta V2$-$\Delta V4$, is set by means of the packing of a plurality of preformed bodies 6, 7-10 which exhibit a temperature- and/or pressure-dependent fourth change in volume $\Delta V4$, into the passivating fluid 5 in such a way that the overall change in volume $\Delta Vin$ of the actuator 2 essentially corresponds to the first change in volume $\Delta V1$ of the casing 3.

Figure 4:
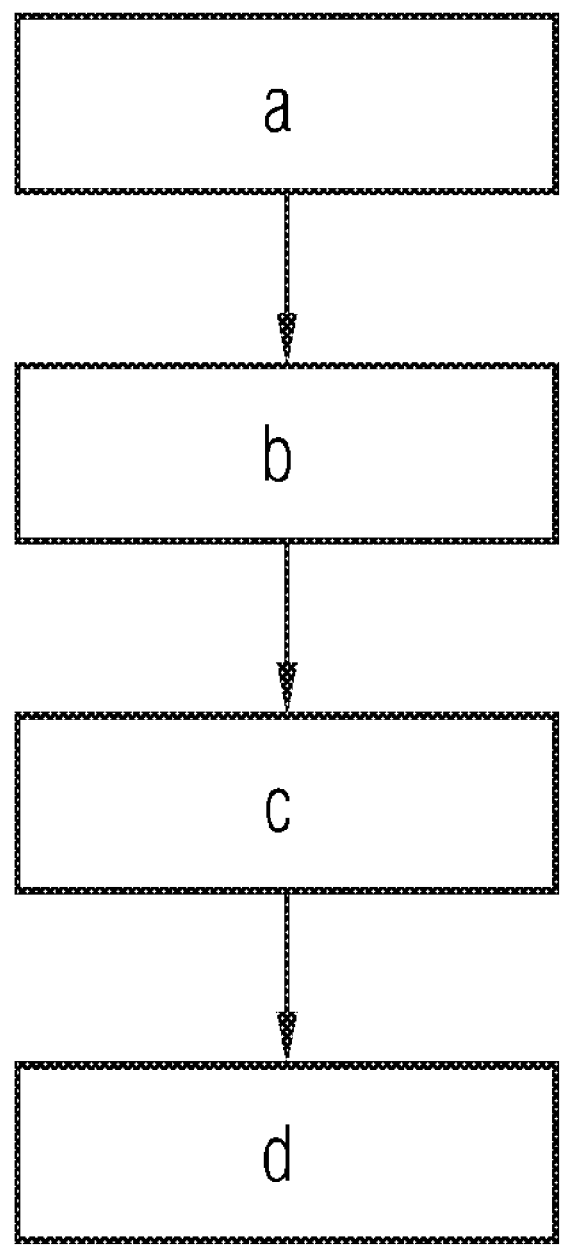
FIG. 4 shows a schematic flowchart of the method according to an embodiment for producing a piezoelectric actuator.

The method according to FIG. 4 is not limited to the sequence described. Thus, for example, the method steps a and d can be transposed.

FIG. 5 shows a diagram for representing the resulting maximum principal normal stresses acting on the casing 3 as a function of the mixing ratio of the transfer agent. The abscissa shows different mixes of the transfer agent. According to the exemplary embodiment shown in FIG. 5 the transfer agent consists of a mixture of a silicone oil Si oil and ceramic balls made of aluminum oxide $Al_2O_3$. In contrast, the stresses, the compressive stress and the tensile stress, are represented in GPa on the ordinate. The diagram according to FIG. 5, which is the result of one calculation performed by the applicant, shows that the stresses steadily decrease as the proportion of $Al_2O_3$ in the transfer agent increases. The experimental result according to FIG. 5 illustrates that the proportion of the fluid Si oil compared to the proportion of $Al_2O_3$ should be minimal for the purpose of reducing the stresses, while at the same time the proportion of the fluid Si oil should be just high enough so that no demixing of ceramic balls $Al_2O_3$ and fluid Si oil can occur.

The piezoelectric actuator 1 according to various embodiments is preferably used in an injection system of a motor vehicle. In this case the piezoelectric actuator 1 will be arranged in particular in the high-pressure chamber of the injection system. The injection system is preferably embodied as a common-rail injection system.

Although the present invention has been described heretofore with reference to the preferred exemplary embodiments, it is not limited thereto, but can be modified in a multiplicity of different ways. For example, a passivation layer can be provided between the transfer agent and the piezoelectric stack whenever a passivation layer, in particular an additional one, is advantageous for the piezoelectric stack. It is also clear to the person skilled in the art that depending on the material used for the casing, all intermediate ranges of the ranges of mixtures of silicone oil and ceramic balls shown in FIG. 5 are possible for the purpose of the minimizing of the stresses acting on the casing.

What is claimed is:

1. A piezoelectric actuator for injecting fuel at a predetermined fuel pressure; comprising:
    a) a casing at least laterally delimiting an actuator interior space and exhibiting at least one of a temperature- and pressure-dependent first change in volume;
    b) a piezoelectric stack arranged in the actuator interior space and exhibiting at east one of a temperature- and pressure-dependent second change in volume;
    c) a transfer agent arranged between the piezoelectric stack and the casing for the purpose of transferring the fuel pressure applied externally to the casing onto the piezoelectric stack, the transfer agent having a passivating fluid which exhibits at least one of a temperature- and pressure-dependent third change in volume and a plurality of preformed bodies which exhibit at least one of a temperature- and pressure-dependent fourth change in volume, the ratio between the passivating fluid and the preformed bodies being set in such a way that the first change in volume of the casing essentially corresponds to an overall change in volume of the actuator interior space which includes at least the second, third and fourth change in volume.

2. The piezoelectric actuator according to claim 1, wherein the actuator interior space is delimited by a top plate, a base plate, the casing and by the piezoelectric stack.

3. The piezoelectric actuator according to claim 1, wherein a difference between the overall change in volume of the actuator interior space and the first change in volume of the casing lies in a predetermined tolerance range.

4. The piezoelectric actuator according to claim 1, wherein the piezoelectric stack is embodied as square-shaped, polygonal or circular cylindrical.

5. The piezoelectric actuator according to claim 1, wherein the casing is embodied as a corrugated tube which has a plurality of N corrugations and in particular is made of metal.

6. The piezoelectric actuator according to claim 1, wherein the passivating fluid is embodied as a silicone oil.

7. The piezoelectric actuator according to claim 1, wherein the preformed bodies are embodied as a plurality of balls.

8. The piezoelectric actuator according to claim 7, wherein the balls are arranged in the passivating fluid in the densest ball packing.

9. The piezoelectric actuator according to claim 5, wherein the preformed bodies are embodied as elastic transfer elements, with preferably at least two elastic transfer elements molded to match the corrugated shape being arranged in at least one corrugation.

10. The piezoelectric actuator according to claim 9, wherein the elastic transfer element is embodied from at least one of steel, ceramic, invar, nylon, and an elastomer.

11. The piezoelectric actuator according to claim 5, wherein the corrugated tube is embodied as a longitudinally and transversely expandable corrugated tube.

12. The piezoelectric actuator according to claim 1, wherein the transfer agent is arranged between the casing the piezoelectric stack in at least one of a form-fit and force-fit manner.

13. The piezoelectric actuator according to claim 1, wherein the coefficient of thermal expansion of the preformed bodies is ten to fifty times less than the coefficient of thermal expansion of the passivating fluid.

14. A method for producing a piezoelectric actuator as claimed in claim 1, said method comprising the steps:
    a) arranging a piezoelectric stack in an actuator interior space, the piezoelectric stack exhibiting at least one of a temperature- and pressure-dependent second change in volume;
    b) at least laterally delimiting the actuator interior space by means of a casing which exhibits at least one of a temperature- and pressure-dependent first change in volume;
    c) filling the remaining actuator interior space between the piezoelectric stack and the casing with a passivating fluid for the purpose of transferring the fuel pressure applied externally to the casing onto the piezoelectric stack, the fluid exhibiting at least one of a temperature- and pressure-dependent third change in volume;
    d) setting an overall change in volume which includes at least the second, third and fourth change in volume by means of the packing of a plurality of preformed bodies which exhibit at least one of a temperature- and pressure-dependent fourth change in volume into the passivating fluid in such a way that the overall change in volume of the actuator interior space essentially corresponds to the first change in volume of the casing.

15. An injection system having a piezoelectric actuator as claimed in claim 1, wherein the piezoelectric actuator is arranged in a high-pressure chamber of the injection system.

16. The injection system according to claim 15, wherein the injection system is embodied as a common-rail injection system.

17. The piezoelectric actuator according to claim 7, wherein the plurality of balls each have at least one of a maximum diameter of 200 μm and consist of an oxide ceramic.

18. The piezoelectric actuator according to claim 9, wherein the elastic transfer element is embodied from Teflon.

19. The piezoelectric actuator according to claim 1, wherein the coefficient of thermal expansion of the preformed bodies is twenty to forty times less than the coefficient of thermal expansion of the passivating fluid.

20. The piezoelectric actuator according to claim 1, wherein the coefficient of thermal expansion of the preformed bodies is twenty-five to thirty-five times less than the coefficient of thermal expansion of the passivating fluid.

* * * * *